United States Patent [19]

Grundon et al.

[11] 3,707,944

[45] Jan. 2, 1973

[54] AUTOMATIC PHOTORESIST APPLY AND DRY APPARATUS

[75] Inventors: Forrest Robert Grundon, Wappingers Falls; Frank Harrison Masterson; Robert John Wagler, both of Poughkeepsie; Fred Ernest Wustrau, Accord, all of N.Y.

[73] Assignee: International Business Machines Corporation, Armonk, N.Y.

[22] Filed: Oct. 23, 1970

[21] Appl. No.: 83,401

[52] U.S. Cl. ....................118/50

[51] Int. Cl. ....................C23c 13/10

[58] Field of Search ....................118/50, 52

[56] References Cited

UNITED STATES PATENTS

| | | | |
|---|---|---|---|
| 2,185,089 | 12/1939 | Kronquest | 118/52 |
| 2,516,908 | 8/1950 | Pottle | 118/50 |
| 3,538,883 | 11/1970 | Polin | 118/50 X |
| 3,357,856 | 12/1967 | Ragan et al. | 118/50 X |
| 3,475,867 | 11/1969 | Walsh | 118/52 X |
| 2,303,774 | 12/1942 | Van Der Willigen et al. | 118/52 UX |
| 3,494,326 | 2/1970 | Upton | 118/50 |

OTHER PUBLICATIONS

IBM Technical Disclosure Bulletin. Centrifuge Rack. H. U. Auslander Vol. 8 No. 8 Jan. 1966 Pgs. 1028, 1029

*Primary Examiner*—James Kee Chi
*Attorney*—Hanifin & Jancin and Daniel E. Igo

[57] ABSTRACT

Apparatus for automatically positioning articles, as silicon semiconductor wafers, on rotary spin assembly mechanisms and indexing transporting means and a means for holding said wafer thereon combined with a means for dispensing a predetermined amount of photoresist solution on said wafers and spinning a uniform film of solution on the wafers and spin air drying through a sequence of rotating indexing steps followed by automatic transfer to and through drying means and a means for unloading therefrom and transporting the wafers to a receiver holder for further processing and transportation.

6 Claims, 14 Drawing Figures

INVENTORS
F. ROBERT GRUNDON
FRANK H. MASTERSON
ROBERT J. WAGLER
FRED E. WUSTRAU

BY [signature]
ATTORNEY

AUTOMATIC PHOTORESIST APPLY AND DRY APPARATUS

This invention relates to an apparatus for the automatic application of uniform emulsion coatings on semiconductor wafer substrates. Photomasking and photoetching procedures are key steps in the manufacture of modern semiconductor devices and it is essential that photoresist coatings on semiconductor wafers be thin, uniform and adherent.

Photo sensitive materials are applied to semiconductor substrate wafers by dipping, spraying, and whirl or spin techniques. Photoresist coatings applied in any manner are dried to remove solvents which increases photo sensitivity and adherence to the substrate. Typically, the resists are dried by air, moderate heating in ovens, upon hotplates or by means of infrared lamps and panels. Drying temperatures must be maintained below degradation limits specific to each particular photoresist compound employed.

It is the object of the present invention to provide a new and improved method and apparatus for applying photosensitive materials to semiconductor wafer substrates.

A further object of this invention is to provide an improved and completely automated apparatus capable of continuous operations with minimum supervision.

Another object is to provide a process and apparatus capable of continuously producing a uniform product at a higher rate than heretofore possible.

To accomplish these and other objects, as an illustrative specific embodiment, silicon semiconductor wafers are unloaded from carriers alternately onto bifurcated legs of an air slide, the legs joining to position the wafer in a holder superimposed on the peripheral portion of an indexing turntable. As the turntable indexes, the wafer registers with a vacuum chuck on the end of the shaft of a motor which is carried by the turntable. Upon indexing to a subsequent station, photoresist is applied to the surface of the wafer and the motor is actuated spinning the wafer and causing the photoresist material to flow evenly on the wafer and the excess material expelled. Alternately, a precoat may be applied at the first station and at a subsequent station photoresist material dispensed. As the turntable indexes, the wafer is spun and air dried until the pedestal vacuum chuck registers with a second air slide where the vacuum is released from the chuck and the wafers are carried by an air slide onto a palet carrier means which is indexed along a predetermined path over a hotplate from which it is ejected onto the exit carrier slide. The coated wafers are inserted into receiver carriers for transporting and further processing.

The foregoing and other objects, features, and advantages of the invention will be more apparent from the following more particular description of a preferred embodiment, as illustrated in the following drawings, wherein FIG. 1 is a fragmentary plan view of apparatus embodying the present invention;

The general nature of the structure and the overall mode of operation of the subject apparatus will be first described after the specific structure of each of the several means or units will be explained in greater detail. For convenience of explanation, the operation of the apparatus will be described with reference to coating of a silicon semiconductor wafer with a thin film photoresist liquid.

Figure 1:
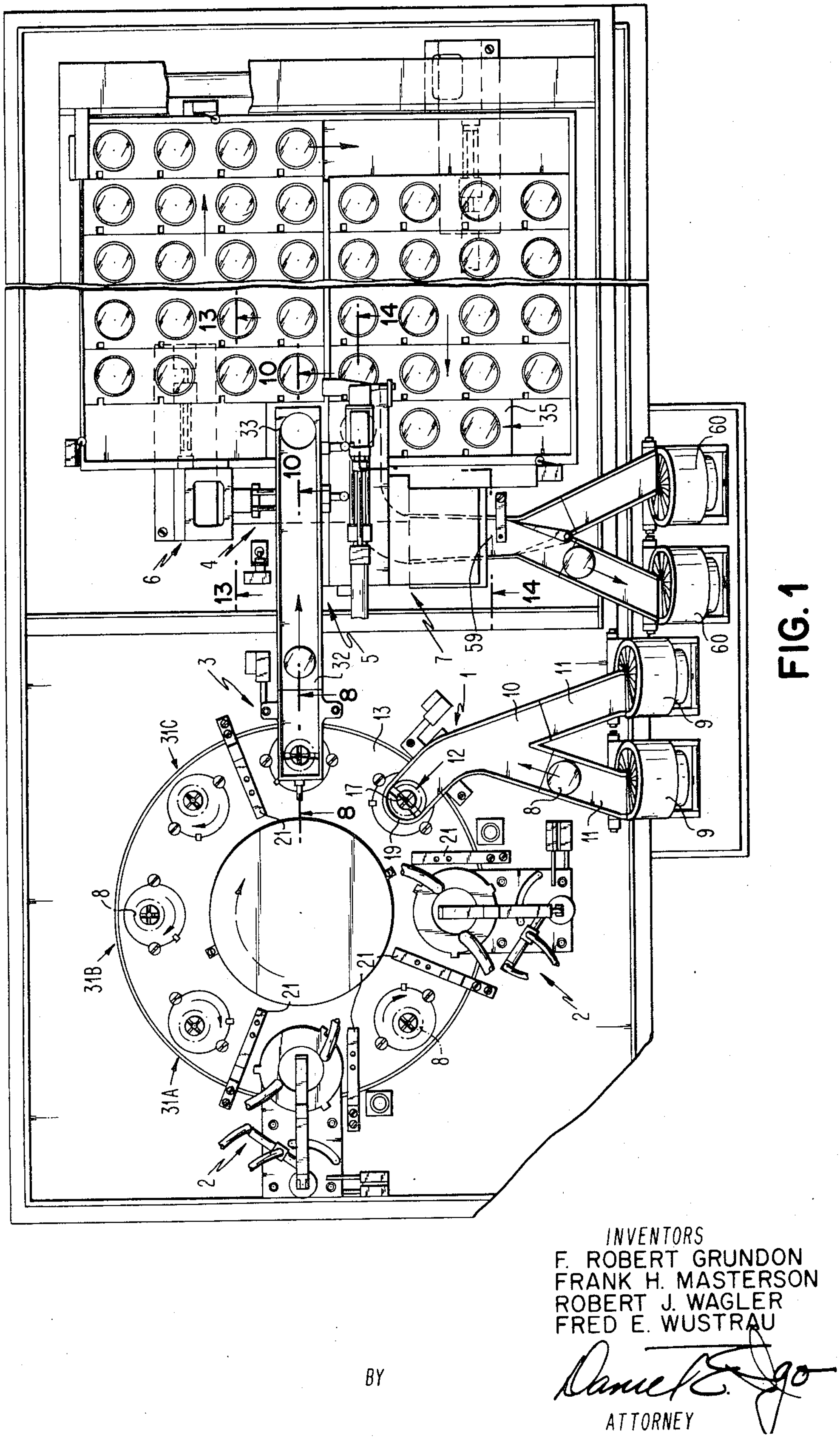

Referring to FIG. 1, a silicon semiconductor wafer 8 is dispensed by any suitable means from conventional holder or carriers 9 to an air slide or chute 10. The wafer holder 9 can be a compartmentalized rotary carrousel type on the rectangular box type wherein wafers are contained in separate compartments or sections from which they are easily dispensed singly at predetermined intervals upon the air chute or any suitable carrier means. Air bearing chutes are particularly adapted to transporting light fragile members and articles such as silicon semiconductor wafers. It was found desirable to utilize bifurcated legs 11 to alternately dispense from two holder carriers 9.

Figure 3:
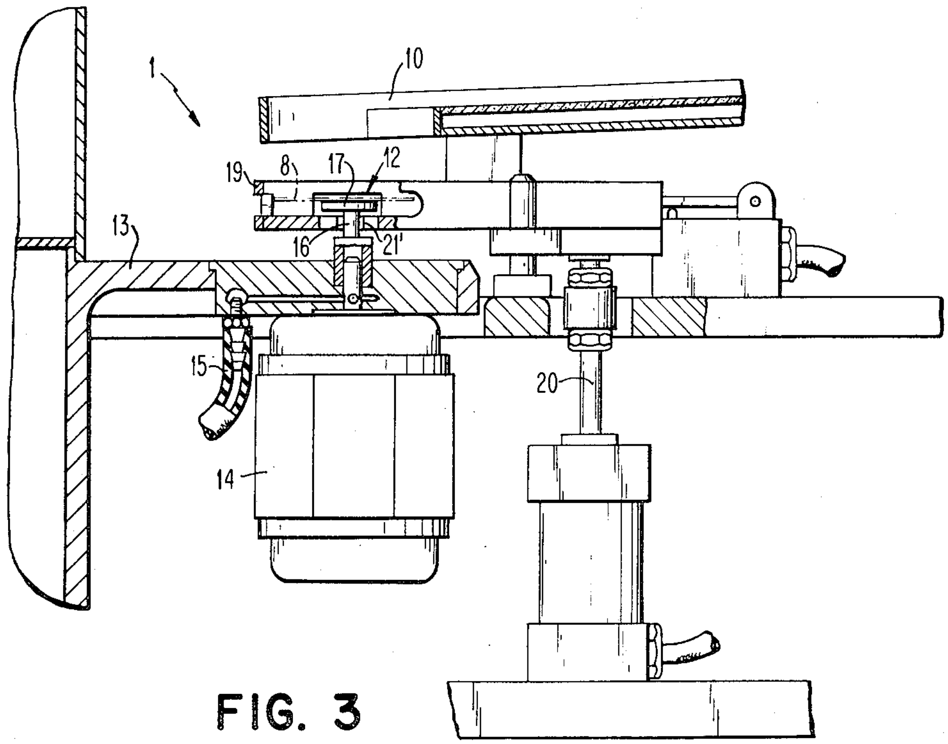
FIG. 3 is a fragmentary sectional view taken along Line 3—3 of FIG. 2.
Figure 2:
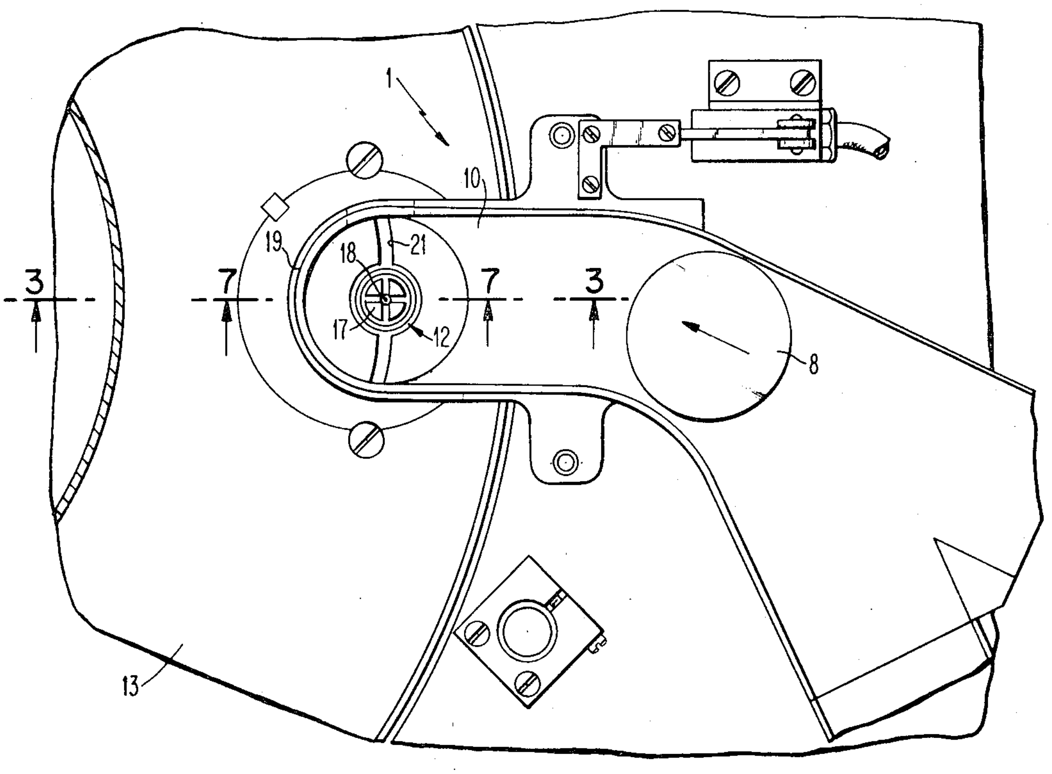
FIG. 2 is an enlarged fragmentary plan view of a portion of the apparatus in FIG. 1.
Figure 4:
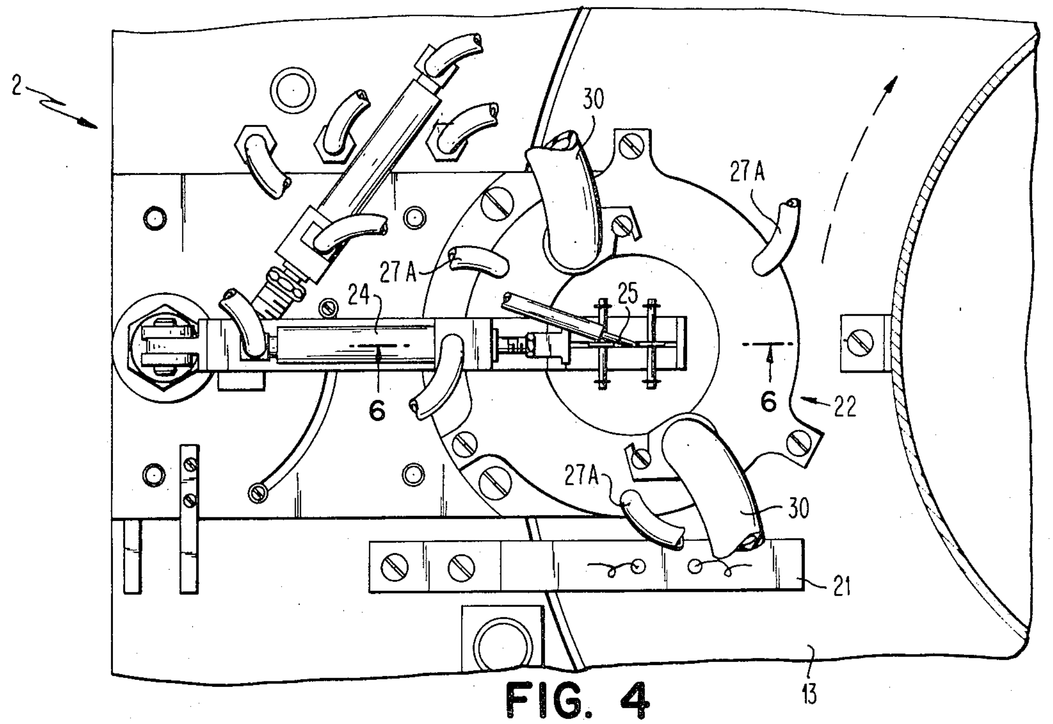
FIG. 4 is an enlarged fragmentary plan view of a portion of the apparatus illustrated in FIG. 1.
Figure 5:
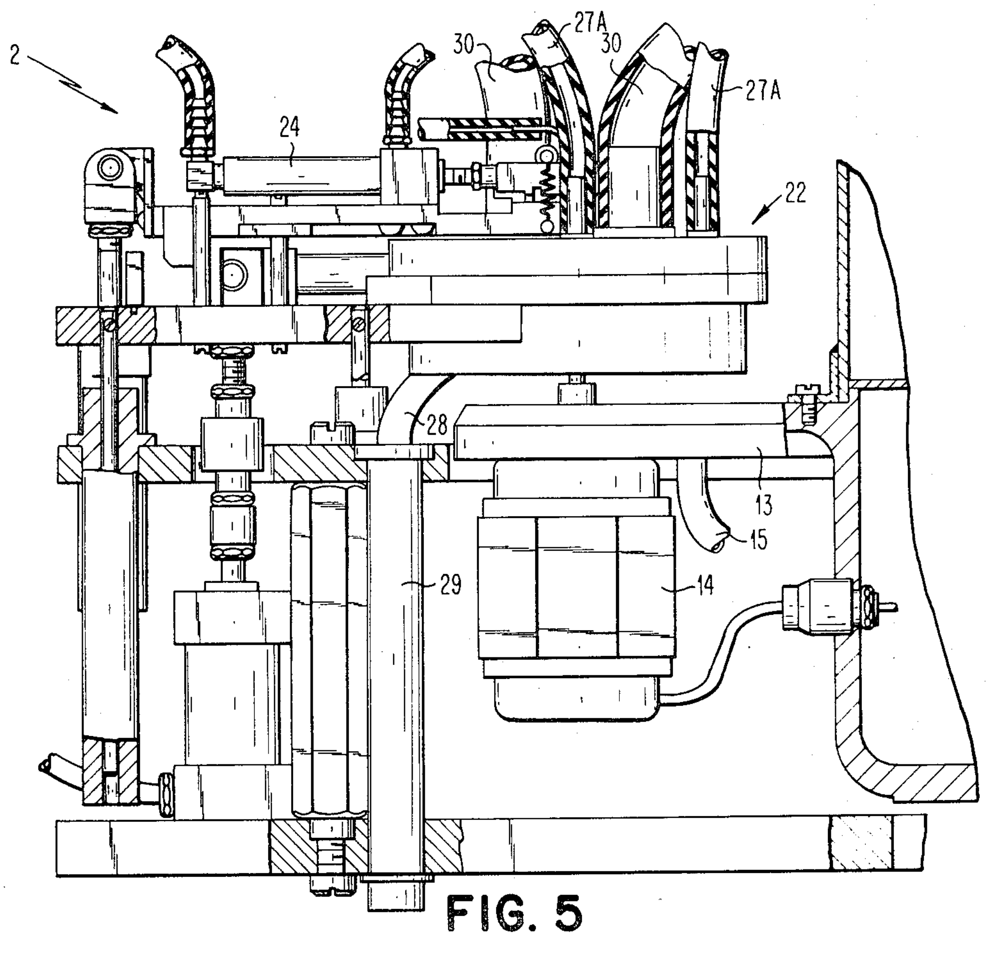
FIG. 5 is a fragmentary side elevational view of the apparatus illustrated in FIG. 4.
Figure 6:
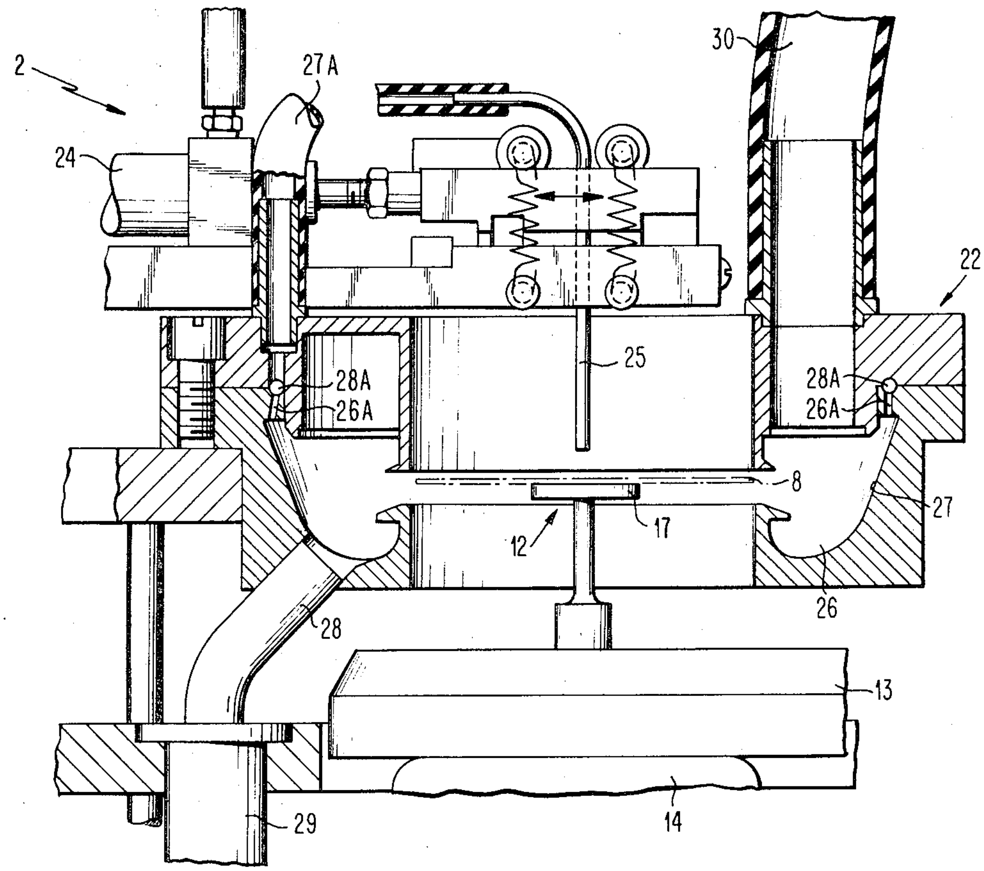
FIG. 6 is an enlarged fragmentary sectional view taken along Line 6—6 of FIG. 4.
Figure 7:
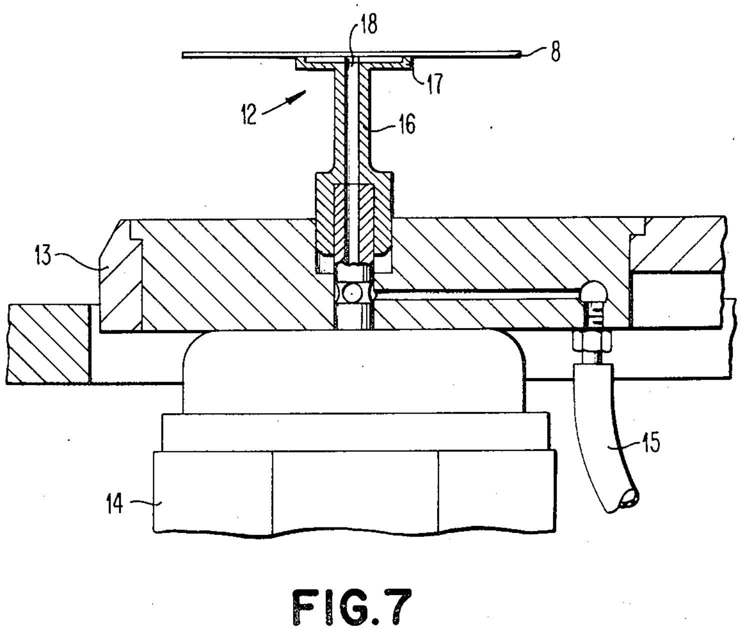
FIG. 7 is an enlarged fragmentary sectional view taken along Line 7—7 of FIG. 2.
Figure 8:
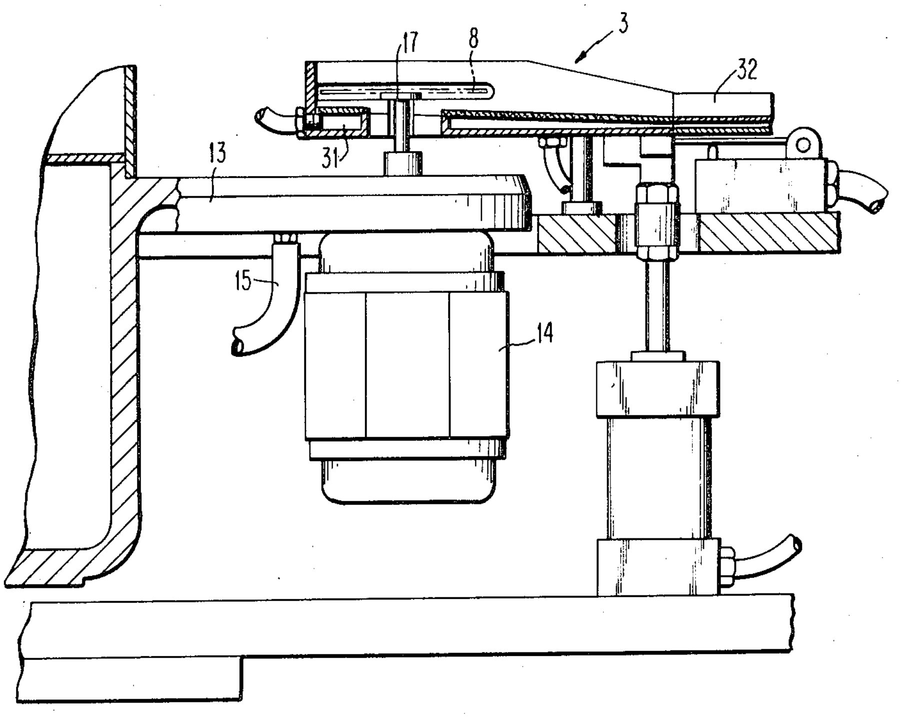
FIG. 8 is a fragmentary enlarged side elevational view taken along Line 8—8 of FIG. 1, and illustrated apparatus constructed with the present invention for transferring wafers from one carrier to transfer means.

Wafer members are conveyed to the wafer positioning and rotatable holding means or spinning pedestal at 1 of FIG. 1 and further illustrated in FIGS. 2, 3, and 7.

Rotatable wafer holding means or spinning pedestal 12 receives the wafer from the air slide and load or positioning cup 19 which lowers and positions the wafer on the rotatable vacuum pedestal head 17. FIG. 3 illustrates the load cup in its lower placement position. Wafer spinning pedestals are disposed about the periphery of an indexing table 13 and are integrally connected to variable speed motor 14 and vacuum source 15. Pedestal shaft 16 contains an annular or other suitable conduct disposed in the pedestal stem 16 and is capable of being evacuated and therefore extending a negative or suction pressure on the wafer disposed upon spinning pedestal head and having vacuum openings at 18. Load cup 19 is raised and lowered by an air actuated shaft 20. Load cup lowers over the vacuum spin pedestal and places the wafer in place on the pedestal.

The load cup arm is slotted at 21′ to allow the wafer and pedestal to clear the cup when the table indexing mechanism actuates the table motor and moves the assembly to the next sequential station. After indexing the cup is raised to receive the next wafer.

After a wafer is secured on the spin pedestal, the indexing table is automatically rotated to the next station where the wafer will receive a predetermined amount of photoresist solution or a precoat material followed by a final coat at a subsequent station illustrated by 2 of FIG. 1. Before a spin pedestal and wafer arrives at the coating station, it is sensed by a photocell 21 which registers the existence and position of a wafer upon the pedestal pursuant to a predetermined mode and configuration. If a wafer is not on the pedestal or is damaged or not in proper configuration, the sensing cell prevents the flow of photoresist solution. This process control prevents the contamination of the vacuum system with photoresist solutions. During the period of indexed travel from the load station to the fluid dispensing station, the wafer is passed through a spin cycle to dispose of any loose surface dust or contaminants.

Upon arrival at dispensing station 2, spinning of the pedestal is stopped and a predetermined photoresist solution is dispersed upon the wafer. When the indexer stops at the dispense station, a dispense cup 22 is automatically lowered over and around the wafer. A pneumatic switch energizes the dispense value air cylinder 24 and a predetermined amount of solution is deposited onto the surface of the wafer through the nozzle 25 whereupon the wafer pedestal is spun at a at a predetermined speed and any excess solution is spun off into the cut and to excess photoresist receiver cup 26, the walls 27 of which are automatically washed with a predetermined amount of photoresist solvent whereupon the dissolved photoresist flows from the cup through conduct 28 to a receiver drain tube 29. An exhaust or vent 30 carries away fumes which may develop in the container. Solvent is supplied through supply conduct 27A into a manifold 28A annularly disposed about the receiver cup 26 and having spaced openings 26A for supply solvent work onto the walls 27.

After the photoresist solution is applied and the excess solution spun off, the indexing table moves the wafer spinning upon the pedestal through a series of successive spin stations 31A, 31B, and 31C which air drys the coated wafer whereupon the pedestal and wafer is indexed to the final station at area 3 where the unload mechanism lifts the wafer from the pedestal onto an air slide 32 which transport the wafer from the indexing application apparatus to the drying oven assembly mechanism.

Apparatus functions described above are controlled by a pre-punched card. This card is read by a card reader. The outputs from the reader are checked to insure a complete sensing of the card and are then fed to appropriate timers and control circuits to provide the correct process steps. If the program cycle times are changed, a new card must be punched and inserted into the card reader. This apparatus is applicable to the various different photoresist solutions with varying viscosities. Therefore a different cycle time is required to each photoresist solution being utilized.

The rotating vacuum chuck pedestal and wafer is indexed to the transfer station 3 where an unload mechanism gently lifts the wafer from the pedestal onto an air bearing slide chute for conveyance to the heating or oven section. Pedestal and wafer are indexed onto a slotted receiving member at the entrance to a conveyor air chute 32 where the receiver is elevated by a pneumatically actuated shaft disloging the wafer from the pedestal onto the air slide. The vacuum pedestal is then indexed into the receiving position at 1 whereupon the indexing cycle is repeated. It is apparent that while a given index station is performing its specific function other station mechanisms are performing other process steps associated with the indexing table assembly, thereby allowing for automatic multi-wafer continuous processing.

Figure 9:
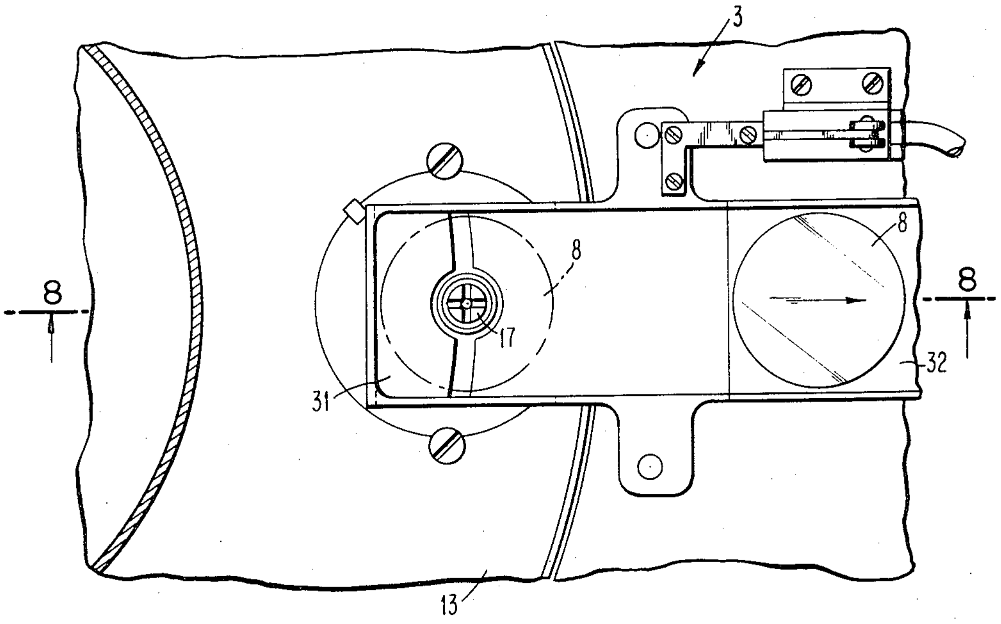
FIG. 9 is a fragmentary plan view of the apparatus shown in FIG. 8 and as if FIG. 8 were not in section.
Figure 10:
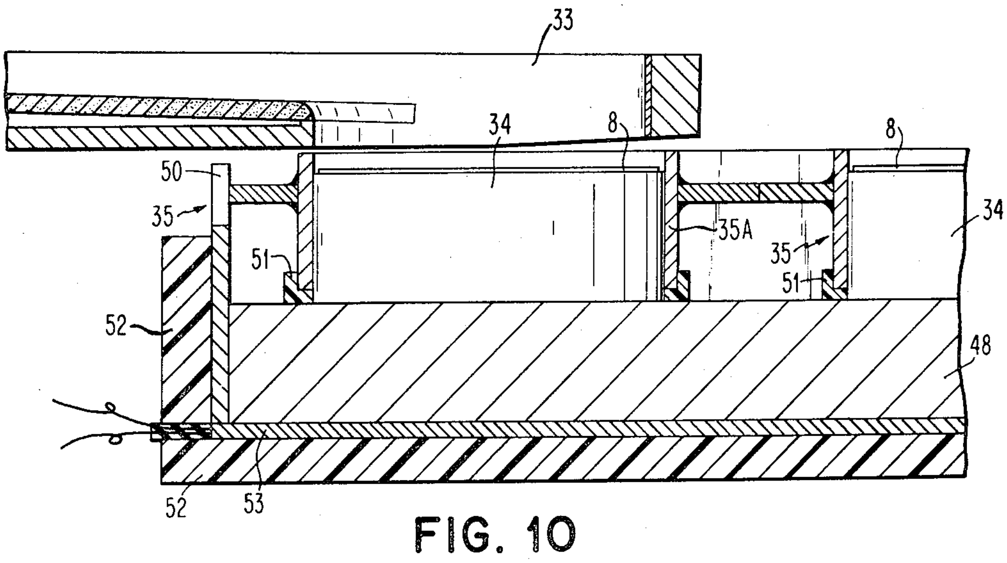
FIG. 10 is a fragmentary side elevational view taken along Line 10—10 of FIG. 1.
Figure 11:
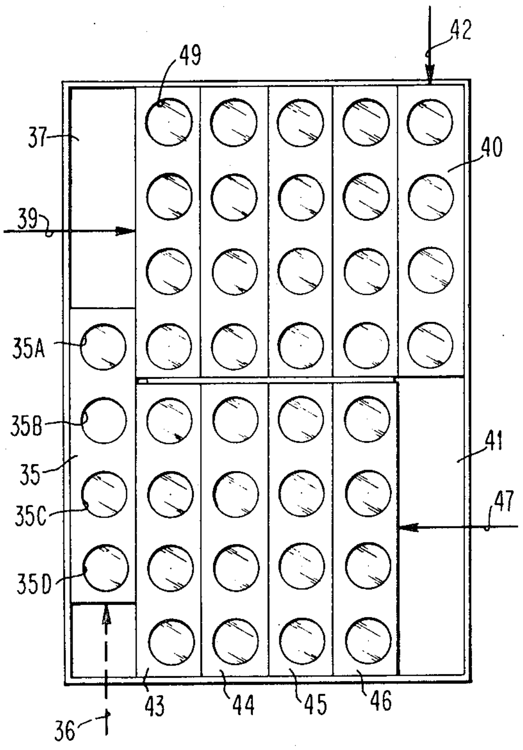
FIG. 11 is a schematic illustration of the progression of wafer shuttle carriers through the oven and illustrating the sequence of the progression.
Figure 12:
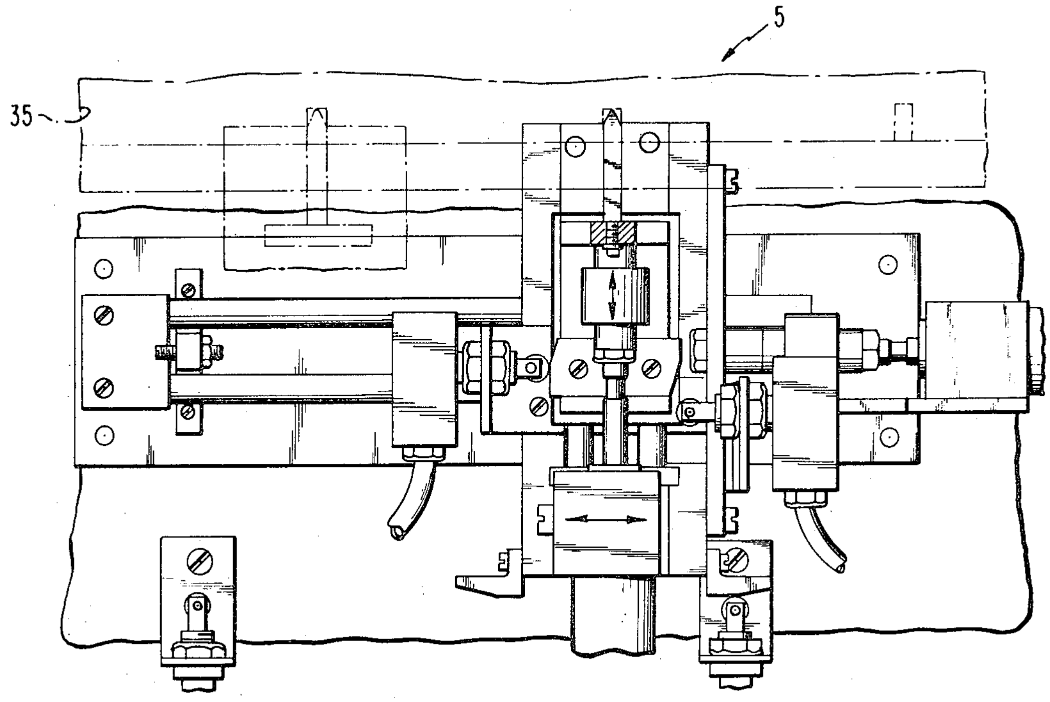
FIG. 12 is an enlarged fragmentary plan view of the apparatus constructed in accordance with the present invention for indexing a shuttle carrier through the unload and load stations as illustrated in FIGS. 1 and 11.
Figure 13:
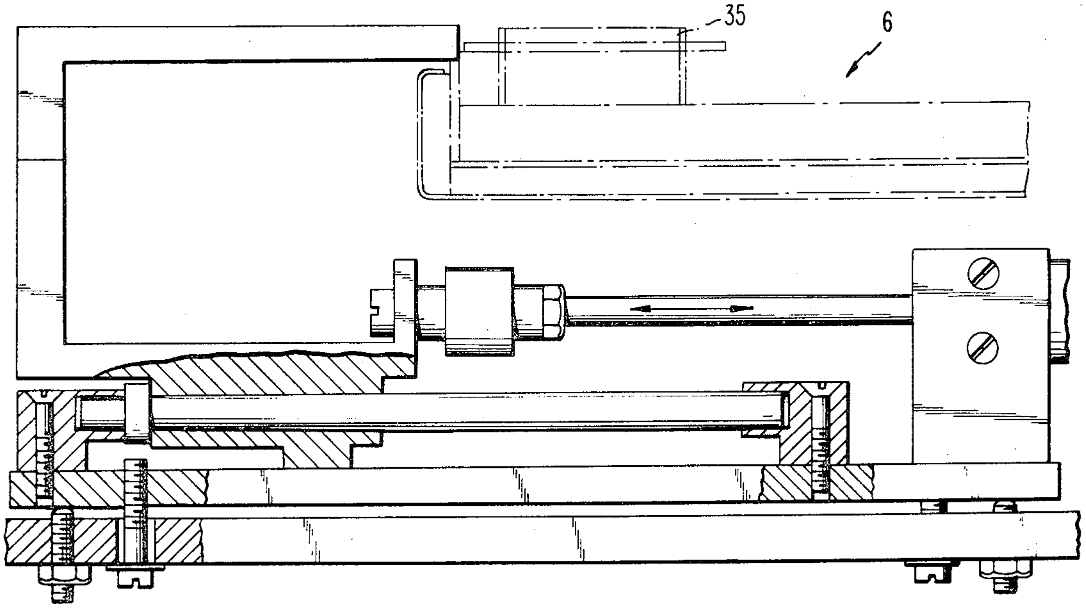
FIG. 13 is a fragmentary side elevational view taken along Line 13—13 of FIG. 1 and illustrating the means of moving the palet carrier through the oven.

Silicon wafers are passed via air chute 32 shown in FIG. 9 onto a loader arm 33—FIG. 10 from which the wafer is gently lowered onto a free floating palet 34 contained in palet carrier 35 containing a multiplicity of recessed receiving cavities 35A–35D, adapted to holding a palet and wafer. The palet is free floating and slides along the surface of the hotplate 44 as the palet carrier 35 traverses the heating area in a predetermined configuration. The palet carrier 35 indexes to receive the next and subsequent coated wafers until all palet carrier cavities are filled and the carrier is indexed along the hotplate surface as illustrated in FIG. 11. FIG. 11 illustrates a palet carrier 35 having received a coated wafer into 35A and indexed in the direction of arrow ——→36. When 35D receives a wafer, the palet carrier is indexed from space 37 one space in the direction of arrow——→39, and simultaneously the palet carrier 40 is indexed into space 41 as illustrated by directional arrow——→42, whereupon palet carrier 43 is indexed into the position of former palet carrier 35 and is in a position for sequential loading of the palet carrier receiver ports. Correspondingly palet carriers 44, 45, and 46 are indexed as illustrated by the directional arrow 47. This sequential movement provides a convenient cycle time for simultaneously loading and unloading in the heating zone.

Each palet rests upon a hotplate 44 which is capable of being heated by any suitable means so that heat is transferred from the hotplate to the palet containing the wafers.

The palet and wafer are carried along in the carrier by means of a port 49, contained in the carrier. The carrier port is constructed with a flange or lip of sufficient height to contain the palet and wafer within the carrier port. The hotplate palet assembly is provided with side guide 50 and base slide guides 51. Suitable insulation 52 is provided at the assembly base to aid in the heat transfer upward onto the palets. Electrical heating 53 is illustrative of a heating method. After a wafer is loaded into a palet carrier tray, pneumatic switches are activated and cause compressed air activators to move the shuttle palet carriers. Only one tray is in position to receive wafers from the loader arm at any given time. Each palet tray is suitably notched so as to cause each try to stop at the correct position under the loader arm.

Hotplate temperature, time, and rate of each palet tray movement upon the hotplate, frequency of wafer receipt and discharge to and from the hotplate or oven assembly are correlated as to time and indexing movements in a manner to provide a smooth uniform automatic process flow.

Figure 14:
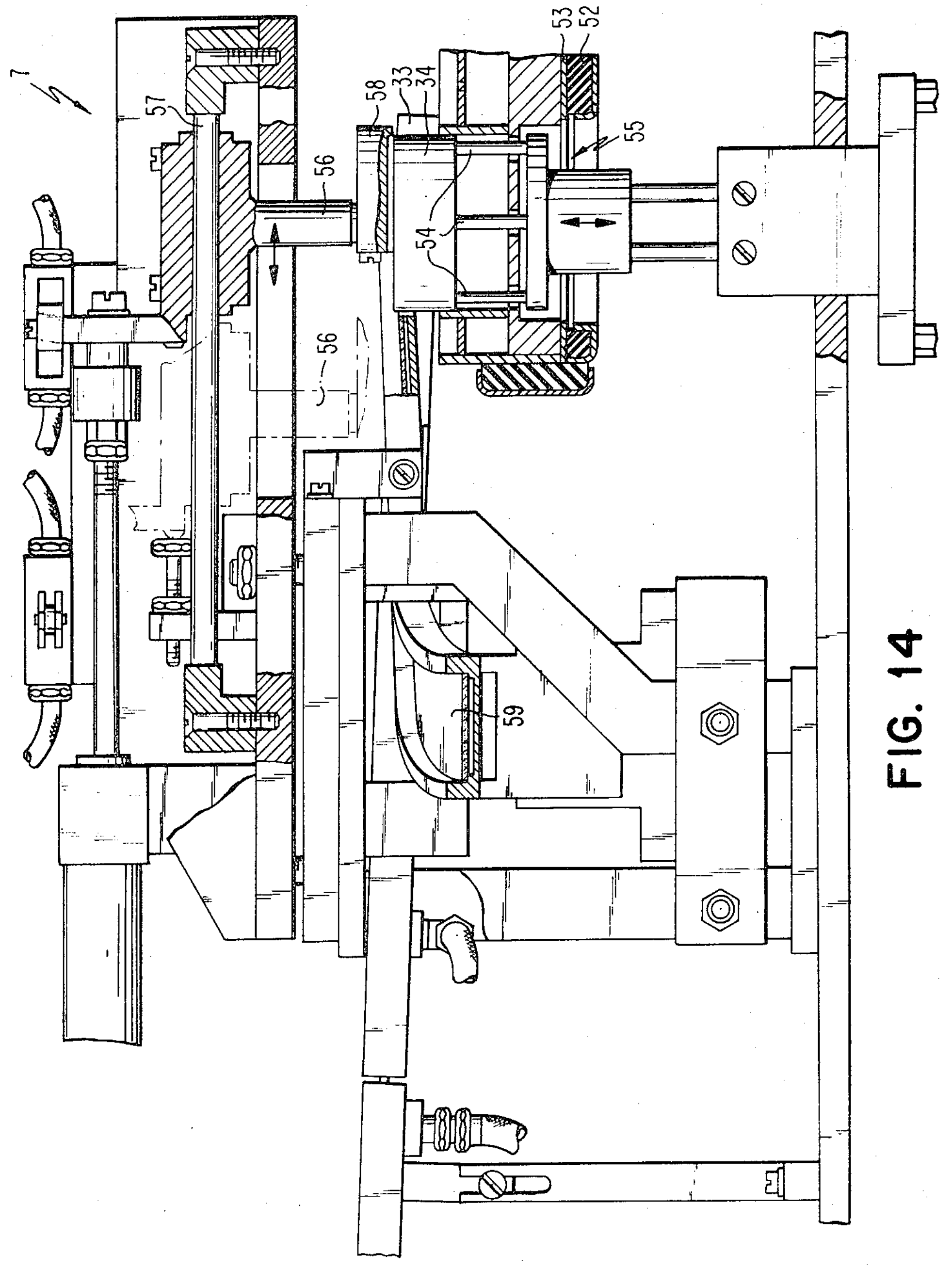
FIG. 14 is a fragmentary sectional side elevational view taken along Line 14—14 of FIG. 1.

Palet carrier tray containing wafers upon palets having passed through the oven or hotplate heating cycle reaches location 7 where the wafer is removed from the palet. Palet unloading or wafer removal is accomplished by means of ejector pins 54 shown in FIG. 14. When a palet is superimposed upon the ejector pin area 55 of the hotplate, the pin ejector assembly is actuated moving the pins vertically and lifting the palet and wafer upward to a position whereby the unloading arm 56 moves horizontally on shaft 57 to slide the wafer from the palet. The wafer pusher cup 58 and ejector pin movements are so coordinated and timed as to start the pin downward as the wafer is removed from the palet onto the unloading arm slide. The unload pusher or cup moves horizontally on shaft 56 as illustrated in FIG. 14. The wafer is carried by the air slide 59 to a suitable unload receiver 60.

Fluid dispensing, spinning, indexing, transfer operations and hotplate or oven drying are enclosed on all sides within a suitable transparent case. Enclosure maintains a clean atmosphere around the apparatus and confines any photoresist and solvent vapors for easy exhausting.

Similarly, appropriate electrical and pneumatic interlocks are provided for properly timed sequential and simultaneous/process procedural execution and acts to eliminate safety hazards. Photocells are utilized to detect damaged or improperly aligned wafers. Photocell detection is interlocked with photoresist solution dispensing and avoids ejection of solution upon an empty pedestal or a damaged wafer.

The hotplate and oven assembly is sequenced by pneumatic logic. A clock supplies a signal through a solenoid valve to start the oven sequence. Termination of the hotplate shuttle sequence a signal is returned through aperture sensing switch to indicate a cycle completion.

Pedestal spin motors are mounted on the rotatable indexing table and programmed by a punch card and reader, the delay spin timer for the dispensing stations, and mechanical cams in the indexer.

Fast deceleration spin motors are required to stop spinning as the index mechanism enters a dispensing station because fluid is discharged on the wafer only when the wafer is in a stationary position. However, the machine program can be changed to permit dispensing on a spinning wafer. Spin-motors may be operated with fixed or variable speeds.

The index mechanism is the positioning device which rotates the table containing the vacuum chuck rotatable pedestals.

While the invention has been particularly described and shown with reference to the preferred embodiments thereof, it will be understood by those skilled in the art that various changes in form and details may be made therein without departing from the spirit and scope of the invention.

What is claimed is:

1. Apparatus for applying and drying a liquid film on workpieces, comprising in combination:

a. an indexing transport means having periods of movement and periods of dwell, including a plurality of spaced apart, rotatable, workpiece holding means mounted thereon;

b. means for positioning a workpiece on at least some of said holding means during the dwell portion of the indexing cycle;

c. means for applying a liquid on said workpieces, and means for spinning said workpiece holding means subsequent to said liquid application;

d. heating and drying means, a plurality of workpiece carriers associated with said heating and drying means, means for removing workpieces from said workpiece holders onto said carriers, and means for effecting a shuttling of said workpiece carriers in a predetermined path through said heating and drying means to effect drying of said liquid on said workpieces, and means for removing said workpieces from said heating and drying means.

2. An apparatus of claim 1 wherein said workpiece is a silicon semiconductor wafer and said liquid to be applied is a photoresist.

3. An apparatus of claim 1 wherein said transport means is mounted for rotation in a circular path.

4. Apparatus in accordance with claim 2 wherein said indexing transport means comprises a circular, horizontally positioned table.

5. Apparatus in accordance with claim 4 wherein each of said holding means for said semiconductor wafers comprises a pedestal having a vertical shaft with a bore therein and means integral with said horizontal table, at one end of said shaft for drawing a vacuum therethrough.

6. Apparatus in accordance with claim 1 wherein said heating and drying means comprises a hot plate, and said carrier comprises a pallet having a plurality of recessed, workpiece receiving cavities therein, each for receiving a workpiece, and means for moving said carrier to receive workpieces sequentially into said cavities in said carrier.

* * * * *